(12) United States Patent
Motz

(10) Patent No.: US 6,927,572 B2
(45) Date of Patent: Aug. 9, 2005

(54) METHOD AND APPARATUS FOR THE COMPENSATION OF DYNAMIC ERROR SIGNALS OF A CHOPPED HALL SENSOR

(75) Inventor: Mario Motz, Wernberg (AT)

(73) Assignee: Infineon Technologies, AG, Munich (DE)

( * ) Notice: Subject to any disclaimer, the term of this patent is extended or adjusted under 35 U.S.C. 154(b) by 254 days.

(21) Appl. No.: 10/357,983

(22) Filed: Feb. 4, 2003

(65) Prior Publication Data

US 2003/0155912 A1 Aug. 21, 2003

(30) Foreign Application Priority Data

Feb. 4, 2002 (DE) .......................................... 102 04 427

(51) Int. Cl.[7] .............................................. G01R 33/06
(52) U.S. Cl. ........................................ 324/250; 324/225
(58) Field of Search ................................ 324/251, 225, 324/207.12, 207.2; 327/510, 511

(56) References Cited

U.S. PATENT DOCUMENTS

| | | | | |
|---|---|---|---|---|
| 5,604,433 A | * | 2/1997 | Theus et al. | ................ 324/251 |
| 5,621,319 A | | 4/1997 | Bilotti et al. | |
| 5,747,995 A | * | 5/1998 | Spies | ...................... 324/207.2 |
| 6,362,618 B1 | * | 3/2002 | Motz | ......................... 324/251 |
| 6,674,322 B2 | * | 1/2004 | Motz | ............................. 330/9 |

FOREIGN PATENT DOCUMENTS

| | | |
|---|---|---|
| DE | 195 36 661 | 4/1997 |
| DE | 199 46 626 | 4/2001 |
| DE | 100 32 530 | 1/2002 |

OTHER PUBLICATIONS

Sensors and Actuators 76 (1999) 178–182—CMOS Versus Bipolar Hall Plates Regarding Offset Correction—Sandra Bellekom.

* cited by examiner

*Primary Examiner*—Edward Lefkowitz
*Assistant Examiner*—Reena Aurora
(74) *Attorney, Agent, or Firm*—Schiff Hardin LLP

(57) ABSTRACT

A method for compensation of dynamic error signals of a chopped Hall sensor that comprises at least one Hall sensor element comprising a plurality of terminal pairs for impressing an excitation current through the Hall sensor element and for taking a Hall voltage. The terminal pairs for impressing the excitation current and for taking the Hall voltage are switched in a first and/or second rotational sense. In order to compensate dynamic error signals caused by the switching, the Hall voltages taken at the terminal pairs when switching in the first rotational sense are supplied to a summation and/or averaging analysis unit together with the Hall voltages taken at the terminal pairs when switching in the second rotational sense.

16 Claims, 4 Drawing Sheets

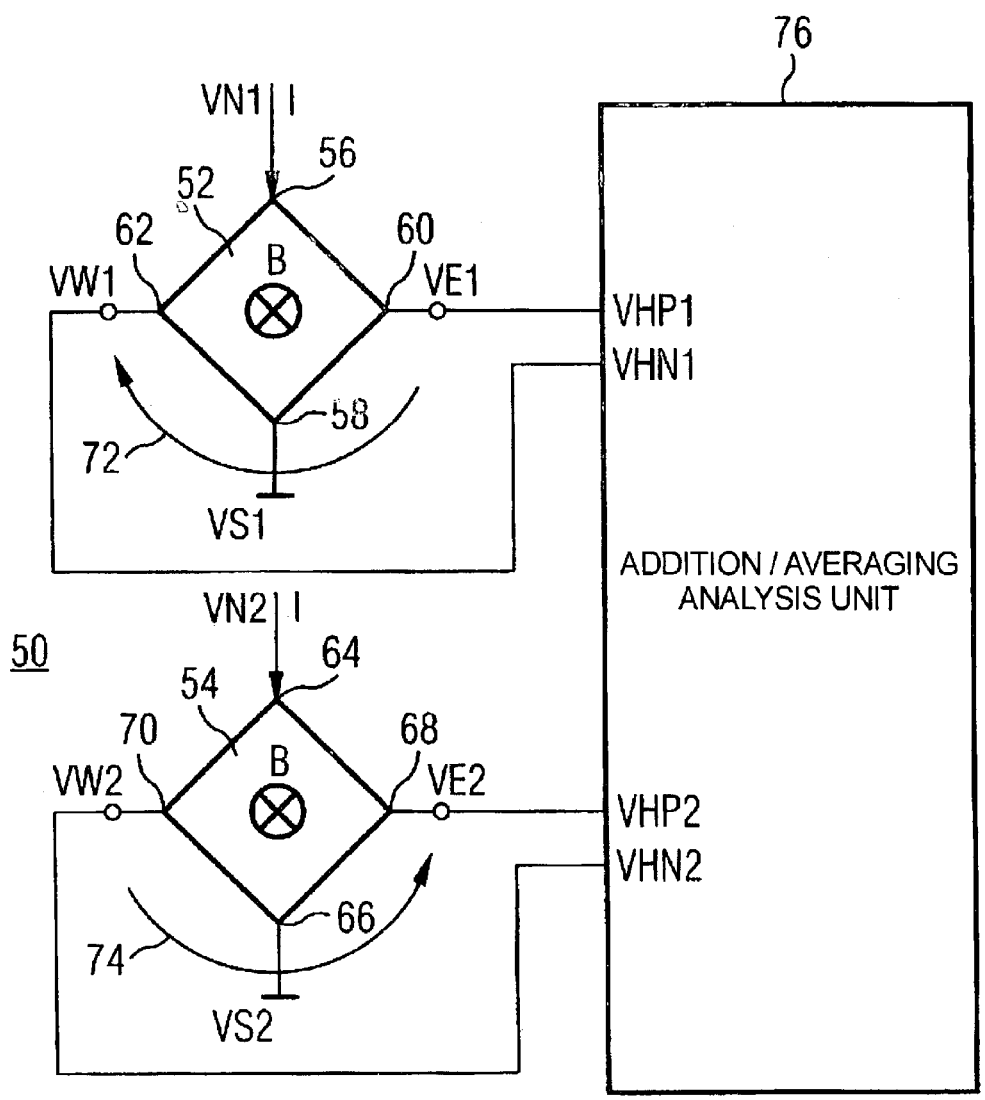

US 6,927,572 B2

METHOD AND APPARATUS FOR THE COMPENSATION OF DYNAMIC ERROR SIGNALS OF A CHOPPED HALL SENSOR

BACKGROUND OF THE INVENTION

The invention is directed to a method and apparatus for the compensation of dynamic error signals of a chopped Hall sensor.

Hall sensors are magnetic field sensors that are based on the Hall effect. The Hall effect arises when the electrons of an excitation current move through a Hall sensor in a transverse magnetic field. As a result of the Lorentz force acting on the electrons, an electric field forms approximately transverse to the direction of current, this corresponding to an electrical voltage that is referred to as a Hall voltage.

In the practical application of Hall sensors, it is required for exact magnetic field measurements that unwanted offset voltages be eliminated from the Hall voltage or that these be at least suppressed as well as possible. Examples of offset voltages are the ohmic and the capacitive homopolar components of a Hall sensor or sensor element.

Hall sensors are usually manufactured of a semiconductor upon application of traditional methods of semiconductor technology. A plurality of Hall sensor elements that form a Hall sensor together with electronics for signal processing are often manufactured as an integrated circuit and also are mounted on a chip carrier and in a housing made of plastic.

As a result of production tolerances and the mounting, however, bendings can occur in the semiconductor crystal of the integrated Hall sensor circuit, these, in particular, leading to the aforementioned ohmic homopolar components.

Various methods are known for the compensation of offset voltages. Given high-precision Hall sensors, for example, what is referred to as quadrature switching or a spinning Hall switchover (also called spinning Hall principle) is utilized. Hall sensors wherein these methods are applied are also referred to as chopped Hall sensors. U.S. Pat. No. 5,406,202 discloses such a chopped Hall sensor.

Given chopped Hall sensors, the direction of the (excitation) current through a Hall sensor element is periodically changed. The direction of the offset voltages also changes as a result thereof; given a quadrature switching, only the operational sign of the offset voltages is changed, viewed mathematically. The offset voltages can therefore be ideally removed from the actual measured signal by means of an addition of the output voltages of a chopped Hall sensor. In practical embodiments, a switching with a prescribed (switching) frequency is periodically undertaken between various terminals of the Hall sensor elements via which the (excitation) current is impressed into the Hall sensor element.

FIG. 1 shows the effect of a 90° switchover given an approximately quadratic Hall plate having two terminal pairs as a Hall sensor element that is situated in a magnetic field B. The terminals of the two terminal pairs are respectively attached at a corner region of the Hall plate. An approximation model of the Hall plate is shown in the form of a resistance network. The Hall plate is situated in a magnetic field B. In phase 1, an excitation current I is impressed into terminals of a first terminal pair of the Hall plate. The output voltage obtained in phase 1 is shown in the diagram at the top in FIG. 1. It comprises the actual measured signal of the magnetic field that is referenced "magnetic field" and is the Hall voltage Vhall. It also comprises offset voltage Voffset of the Hall plate and of an operational amplifier for amplifying the output signal.

In phase 2, the direction of the current I through the Hall plate is turned by 90° in that this is impressed into the terminals of a second terminal pair of the Hall plate. As a result thereof, the operational sign of the offset voltages Voffset changes when—as shown on the basis of the resistance network—the output voltage is measured at the terminals via which the current I was impressed in phase 1.

FIG. 2 shows a Hall sensor element with a plurality of terminals that are arranged approximately equally spaced at the edge of the Hall sensor element. This Hall sensor element is an octagonal Hall plate. A terminal is attached to each corner. The illustrated eight terminals form four terminal pairs via which an excitation current can be impressed into the Hall plate or a Hall voltage can be taken.

Given this Hall sensor element, the excitation current I can be cyclically impressed in the arrow direction. As a result thereof, the payload signal is constantly present over a plurality of clock cycles, whereas error signals average out. The diagram at the top in FIG. 2 illustrates this, and shows the time curve of the output voltage V cyclically taken at the terminals that comprises the Hall voltage Vhall and offset voltages Voffset. This operating mode of a Hall sensor is referred to as a spinning Hall principle.

However, parasitic capacitances must be recharged, these particularly occurring due to the terminals, leads to the terminals and switchovers or similar circuit elements. As a result thereof, dynamic error signals, especially in the form of spikes, occur in the measured signal. The dynamic error signals have a more and more disturbing influence on the measured signal the higher the switching frequency is. The share of the dynamic error signals compared to the actual measured signal then increases in the output signal of the Hall sensor element. The otherwise small errors due to offset voltages in chopped Hall sensors are increased again when processing high-frequency signals, i.e. given a high switching frequency.

Various methods have been previously disclosed in order to reduce the dynamic error signals. What is probably the simplest method for reducing the influence of dynamic error signals is a reduction of the chopper frequency. In most applications, however, the payload signal frequencies are fixed, so that a high circuit-oriented expense—usually an involved filtering—is required in order to separate payload and error signals. It has also already been proposed to utilize a slow inner and a fast outer chopper loop, which likewise requires a high circuit-oriented expense (see 2000 IEEE International Solid-State Circuits Conference 07803-5853-8/00 "TA 9.4 A CMOS Nested Chopper Instrumentation Amplifier with 100 nV Offset", Anton Bakker, Kevin Thiele 1, Johan Huijsing). It is also known to use long chopper times in order to reduce the influence of dynamic error signals on the payload signal. Moreover, U.S. Pat. No. 5,621,319 discloses that a long dead phase be realized during the switching in order to optimally blank out the effects of the dynamic error signals.

Particularly given spinning Hall sensors, all of the above techniques only suppress dynamic error signals up to a specific mass and also diminish the time resolution as well as the bandwidth of the payload signal.

SUMMARY OF THE INVENTION

It is an object of the invention to specify a method and apparatus for the compensation of dynamic error signals of a chopped Hall sensor wherein neither the time resolution nor the payload signal bandwidth is limited less than in the Prior Art due to the compensation.

This object is achieved by a method for the compensation of dynamic error signals of a chopped Hall sensor wherein at least one Hall sensor element is provided having a plurality of terminal pairs for impressing an excitation current through the Hall sensor element and for taking a Hall voltage. The terminal pairs for impressing the excitation current and for taking the Hall voltage are switched in a first and/or a second rotational sense. The Hall voltages taken at the terminal pairs when switching in the first rotational sense are supplied to an analysis unit for a summation and/or averaging together with the Hall voltages taken at the terminal pairs when switching in the second rotational sense in order to compensate dynamic error signals caused by the switching.

BRIEF DESCRIPTION OF THE DRAWINGS

FIG. 4 is an exemplary embodiment of the apparatus with a chopped Hall sensor for the compensation of dynamic error signals given two Hall plates that are connected and operated parallel.

DESCRIPTION OF THE PREFERRED EMBODIMENT

Figure 1:
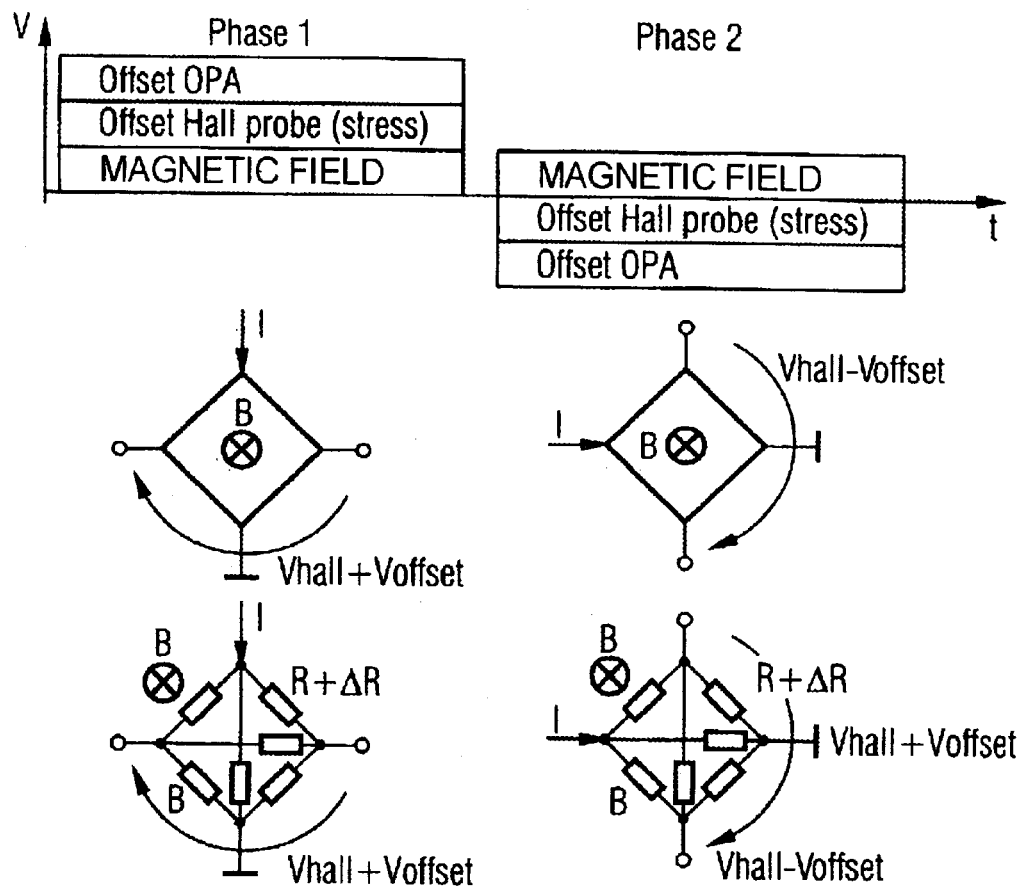
FIG. 1 is a Hall plate that is operated with quadrature switching of the excitation current according to the Prior Art, and diagrams with the voltages that thereby occur.

For the purposes of promoting an understanding of the principles of the invention, reference will now be made to the preferred embodiment illustrated in the drawings and specific language will be used to describe the same. It will nevertheless be understood that no limitation of the scope of the invention is thereby intended, such alterations and further modifications in the illustrated device, and/or method, and such further applications of the principles of the invention as illustrated therein being contemplated as would normally occur now or in the future to one skilled in the art to which the invention relates.

A method is provided for the compensation of dynamic error signals of a chopped Hall sensor that comprises at least one Hall sensor comprising a plurality of terminal pairs for impressing an excitation current through the Hall sensor element and for taking a Hall voltage. The terminal pairs for impressing the excitation current and for taking the Hall voltage are switched in a first and/or a second rotational sense. For example, the excitation current can be impressed into a first terminal pair for a specific time duration while the corresponding Hall voltage is being taken at a second terminal pair. After the expiration of this time duration, a switch is made to a third terminal pair for impressing the excitation current and to a fourth terminal pair for taking the Hall voltage. The terminal pairs are thus continuously cyclically switched. Preferably, switching is respectively undertaken between neighboring terminal pairs. It is also conceivable that the direction of the excitation current that is impressed via a specific terminal pair is inverted in alternation. In this case, one terminal pair suffices for impressing the excitation current.

Different rotational senses of the switching influence the dynamic error signals, particularly their operational sign. This can be advantageously utilized for a compensation of the dynamic error signals, particularly in that the Hall voltages taken at the terminal pairs when switching in the first rotational sense are supplied to a summation and/or averaging together with the Hall voltages taken at the terminal pairs when switching in the second rotational sense. Up to now, the dynamic error signals have limited the precision of chopped Hall sensors. A reduction—not an elimination—of the dynamic error signals was only capable of being achieved at the expense of other parameters of the sensor: either by means of a lower chopper frequency and, thus, a reduced bandwidth of the sensor payload signal or by means of a lower time resolution given a temporal blanking during the occurrence of the dynamic error signals. These disadvantages are eliminated. In particular, a high time resolution is allowed and a high payload signal bandwidth is enabled.

In a first preferred embodiment, the Hall voltages at the terminal pairs when switching in the first rotational sense are taken from at least one first Hall sensor element and the Hall voltages at the terminal pairs when switching in the second rotational sense are simultaneously taken from at least one second Hall sensor element and are supplied to the summation and/or averaging. Given this embodiment, thus, a plurality of Hall sensor elements, at least two Hall sensor elements, are operated parallel. The circuit-oriented expense required for this is countered by a fast processing of the signals of the Hall sensor elements. In contrast to known solutions for the compensation of error signals in the chopped Hall sensor, the circuit-oriented expense is nonetheless slight, particularly since a plurality of Hall sensor elements connected parallel are usually already utilized for noise reasons and for stress compensation.

In a second embodiment, the Hall voltages at the terminal pairs when switching in the first rotational sense and the Hall voltages at the terminal pairs when switching in the second rotational sense are taken from the same Hall sensor element. Viewed temporally, the switching in the first and the switching in the second rotational sense follow successively; the Hall voltages taken in one rotational sense are intermediately stored during the switching in the other rotational sense. This can be applied given single Hall sensor elements or a plurality of Hall sensor elements connected parallel. Given utilization in a single Hall sensor element, the circuit-oriented expense is even lower than in the first embodiment. Of course, a combination of the first and second embodiment is also conceivable.

In a preferred development of the second embodiment, the rotational sense when impressing the excitation current and taking the Hall voltages is changed in that a cyclical change is undertaken from switching in the first onto the switching in the second rotational sense and vice versa. As a result thereof, an efficient compensation of the dynamic errors signals occurs on temporal average, since this changes its operational sign with every change in rotational sense and is thus averaged out of the output signal of the sensor. In the simplest implementation, this can be accomplished by means of a single terminal pair in that the direction of the impressed excitation current is periodically inverted.

In an especially preferred embodiment, the at least one Hall sensor element is operated with a spinning Hall switching. The method can be especially advantageously utilized in a spinning Hall switching, since a high switching frequency at which a great number of dynamic error signals are usually generated is usually employed therein.

The effect of the method can be improved further when an output signal of the chopped Hall sensor is blanked out during the phase of the switching. Although the time resolution is thereby slightly reduced, the compensation of the error signals is correspondingly improved.

An apparatus is provided for the compensation of dynamic error signals of a chopped Hall sensor that comprises at least one Hall sensor element comprising a plurality of terminal pairs for impressing an excitation current through the Hall sensor element and for taking a hall voltage. For impressing the excitation current and for taking the Hall voltage, the terminal pairs can be switched in a first and/or second rotational sense. Structure with which dynamic error signals due to the switching can be compensated are provided for summation and/or averaging of the Hall voltages taken at the terminal pairs when switching in the first rotational sense with the Hall voltages taken at the terminal pairs when switching in the second rotational sense. This structure can be implemented in analog circuit technology or digitally as well following a digitalization of the supplied signals.

Preferably, the structure is designed for the processing of Hall voltages at the terminal pairs when switching in the first rotational sense of at least one first Hall sensor element and of Hall voltages at the terminal pairs when switching in the second rotational sense of at least one second hall sensor element. In other words, the structure can simultaneously process Hall voltages of a plurality of Hall sensor elements.

In another preferred embodiment, the structure is designed for processing Hall voltages at the terminal pairs when switching in the first rotational sense and for processing Hall voltages at the terminal pairs when switching in the second rotational sense of the same hall sensor element and comprise a memory wherein the Hall voltages taken in one rotational sense are intermediately stored during the switching in the other rotational sense. Viewed temporally, the switching in the first and the switching in the second rotational sense occur successively. In this embodiment, the structure can not only simultaneously process a plurality of Hall voltages but can also process dynamic error signals in the output signal of a Hall sensor element of the Hall voltage of only this one Hall sensor element.

The apparatus can be designed such that a cyclical change is made from switching in the first onto the switching in the second rotational sense and vice versa. An especially efficient compensation on temporal average is achieved by means of the cyclical switching. Moreover, a control of the cyclical switching can be implemented with low circuit-oriented expense.

Finally, the apparatus is preferably designed such that the at least one Hall sensor element is operated with a spinning Hall switching.

In order to improve the compensation of dynamic error signals, the apparatus can also be designed such that an output signal of the chopped Hall sensor is blanked out during a phase.

The apparatus is preferably utilized in an integrated sensor circuit, for example in an integrated magnetic field sensor circuit having a plurality of Hall sensor elements and a signal processing electronics for the signals of the Hall sensor elements as well as a control electronics for driving the Hall sensor elements according to the inventive method.

Figure 2:
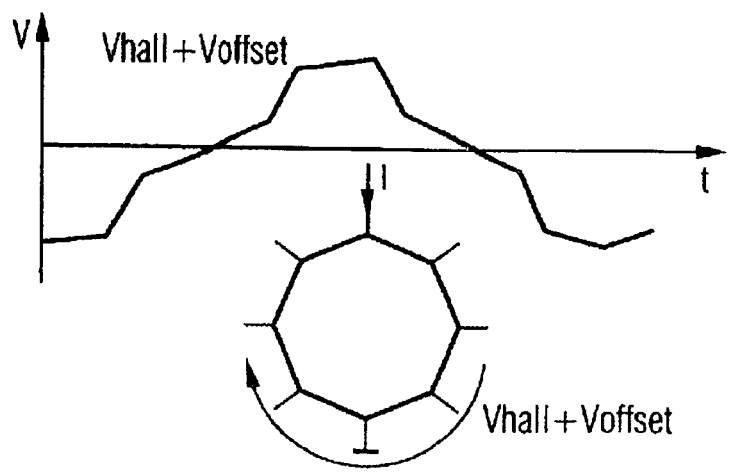
FIG. 2 is a Hall plate that is operated according to the spinning Hall principle according to the Prior Art, and the curve of the output voltage of the Hall plate.

Below, (functionally) identical elements can be provided with the same reference characters. The introduction to the specification is referenced for the description of FIGS. 1 and 2.

FIG. 1A shows the spinning Hall principle at a first chopped Hall sensor 10. This comprises a Hall plate as Hall sensor element 12 with four terminal pairs 14, 16 and 18, 20 and 22, 24 and 26, 28. Each of the illustrated terminals comprises a parasitic capacitance C that is assumed to be of approximately the same size for all terminals here for the sake of simplicity. The parasitic capacitances C are formed by the integrated Hall plate itself as well as by terminal or connecting lines and parasitic capacitances in switchover devices (not shown).

Figure 3A:
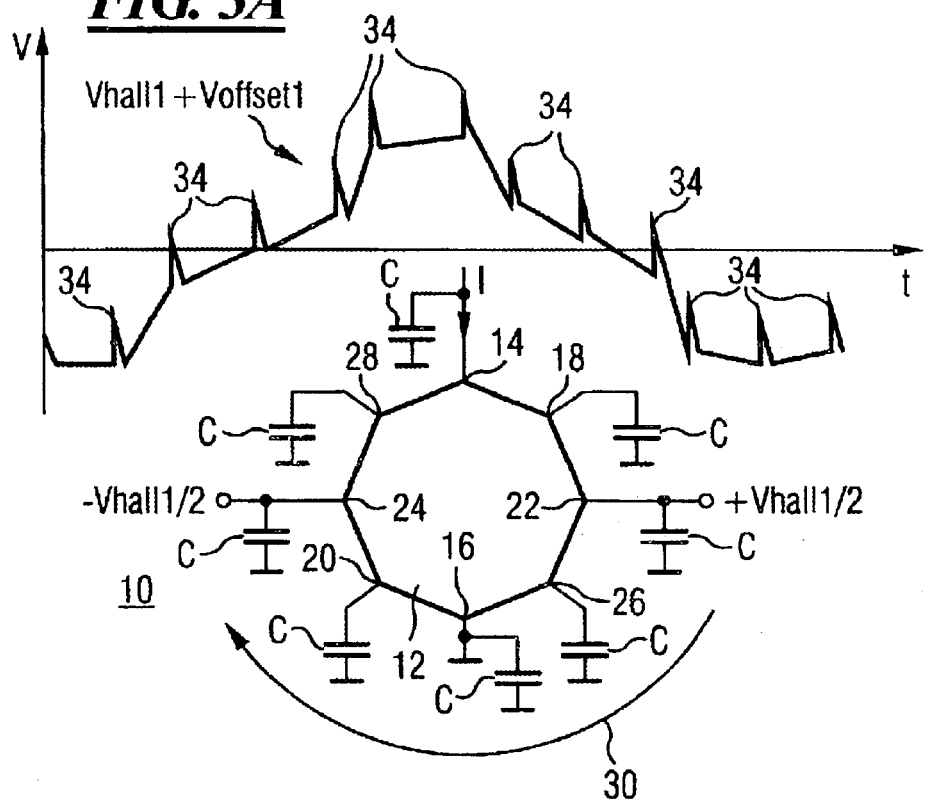
FIG. 3A shows a chopped Hall sensor with a Hall plate wherein an excitation current is connected to the terminals of the Hall plate in a first rotational sense, and a diagram with the dynamic error signals that occur due to parasitic capacitances.
Figure 3B:
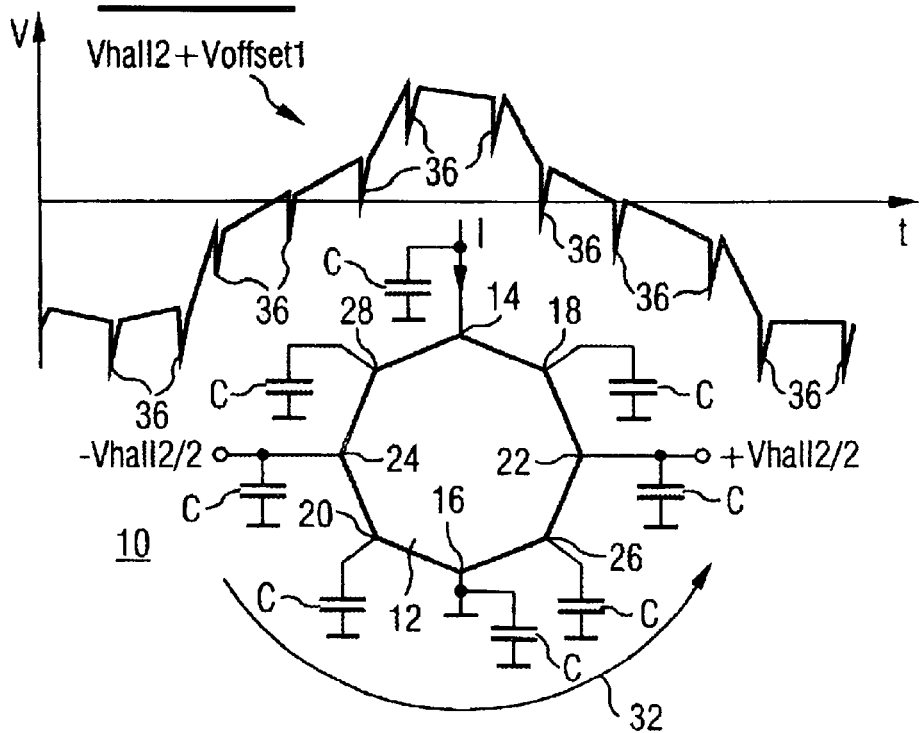
FIG. 3B illustrates the chopped Hall sensor shown in FIG. 3A with the Hall plate wherein an excitation current is connected to the terminals of the Hall plate in a second rotational sense, and a diagram with the dynamic error signals that occur due to parasitic capacitance.

FIGS. 3A, 3B show how an excitation current I is impressed into the terminal pair 14, 16 of the Hall sensor element 12. The Hall voltage Vhall1 that forms in a magnetic field is taken at the terminal pair 22, 24. Compared to terminal 24, the terminal therefore lies at a potential of about +Vhall1/2 and the terminal 24 correspondingly lies at a potential of about −Vhall1/2. The excitation current I can then be successively impressed into the terminal pairs 18, 20 and 22, 24 and 26, 28 and 16, 14 and 20, 18 and 24, 22 and 28, 26 in the first rotational sense 30 (clockwise) indicated by the arrow. The sequence of said terminals of a terminal pair thereby indicates the direction of the current (as in the case of the illustrated current I). The Hall voltage is taken at the terminal pair that describes an angle of about 90° with the terminal pair for impressing the excitation current.

Offset voltages can be compensated by this cyclical change in the direction of the excitation current through the Hall plate. Essentially caused by the parasitic capacitances C, however, dynamic error signals in the form of voltage spikes in the output signal of the chopped Hall sensor, i.e. in the Hall voltage Vhall1 taken at the terminals, occur when switching. The curve of the hall voltage Vhall1 and of the offset voltages Voffset1 are shown in the diagram above the chopped Hall sensor 10. The polarity change of the Hall voltage and offset voltages Vhall1+Voffset1 caused by the first rotational sense 30 can be clearly recognized. Further, voltage spikes 34 in the hall voltage and the offset voltages superimposed thereon can be seen, these falsifying the payload signal, i.e. the actual Hall voltage Vhall1.

FIG. 3B shows the first chopped Hall sensor 10 of FIG. 3A that, however, is operated with a reversed, second rotational sense 32. Differing from FIG. 3A, the excitation current is now successively impressed into the terminal pairs 28, 26 and 24, 22 and 20, 18 and 16, 14 and 26, 28 and 22, 24 and 18, 20 in the second rotational sense 30 (counter-clockwise) indicated by the arrow. The voltage curve of the Hall voltage and of the offset voltages Vhall2+Voffset1, which roughly coincides with the voltage curve shown in FIG. 3A, shown in the diagram above the chopped Hall sensor 10 thereby derives. Differing from FIG. 3A, however, voltage spikes 36 in the Hall voltage and the offset voltages superimposed thereon exhibit an operational sign opposite the spikes 34 of FIG. 3A. However, the spikes 34 and 36 are essentially the same in terms of amount.

The spikes 34 and 36 that are about the same in terms of amount can be removed from the output signal of the chopped Hall sensor 10 by an addition and/or averaging of the Hall voltages and their superimposed offset voltage Vhall1+Voffset1 and Vhall2+Voffset1. This occurs by means of a compensation since the spikes 34 and 36 mutually cancel. The offset voltages Voffset1 likewise mutually cancel. When a single Hall sensor element 12 is utilized, then the Hall voltage Vhall1 taken in the first rotational sense must be intermediately stored for the compensation. This preferably ensues with a sample-and-hold technique. The storing can thereby also ensue digitally. For this purpose, the Hall voltage Vhall1 that has been taken must be converted into a digital signal that can then be digitally deposited, for example with registers or in a dynamic or even static read-write memory. In this case, the addition and/or the averaging of the hall voltages taken by means of different rotational senses likewise occurs digitally, for example by means of a specific logic or a computer.

FIG. 4 shows a second chopped hall sensor 50 that comprises two approximately quadratic Hall plates operated parallel as Hall sensor elements 52 and 54. The two Hall plates are situated in the same magnetic field B. Like the second Hall sensor element 54, the first Hall sensor element 52 comprises four terminals 56, 58, 60, 62 or, respectively, 64, 66, 68, 70 that are respectively attached in a corner region of each Hall plate. Two terminals respectively form a terminal pair 56, 58 and 60, 62 or, respectively, 64, 66 and 68, 70 via which an excitation current can be impressed into the Hall plate or via which a Hall voltage can be taken.

In the first Hall sensor element 52, the excitation current I is impressed in the rotational sense 72 indicated by the arrow. The Hall voltages are taken in the same rotational sense. At the second Hall sensor element 54, the same excitation current I as at the first Hall sensor element 52 is impressed and the hall voltages are taken in a rotational sense 74 opposite the rotational sense 72. The Hall voltages taken at the first and second Hall sensor element 52 and 54—their potentials VW1 (at terminal 62), VE1 (at terminal 60) or VW2 (at terminal 70), VE2 (at terminal 68) to be more precise—are supplied to an analysis unit 76 for the addition and/or averaging via terminals VHP1, VHN1 and VHP2, VHN2.

Figure 5:
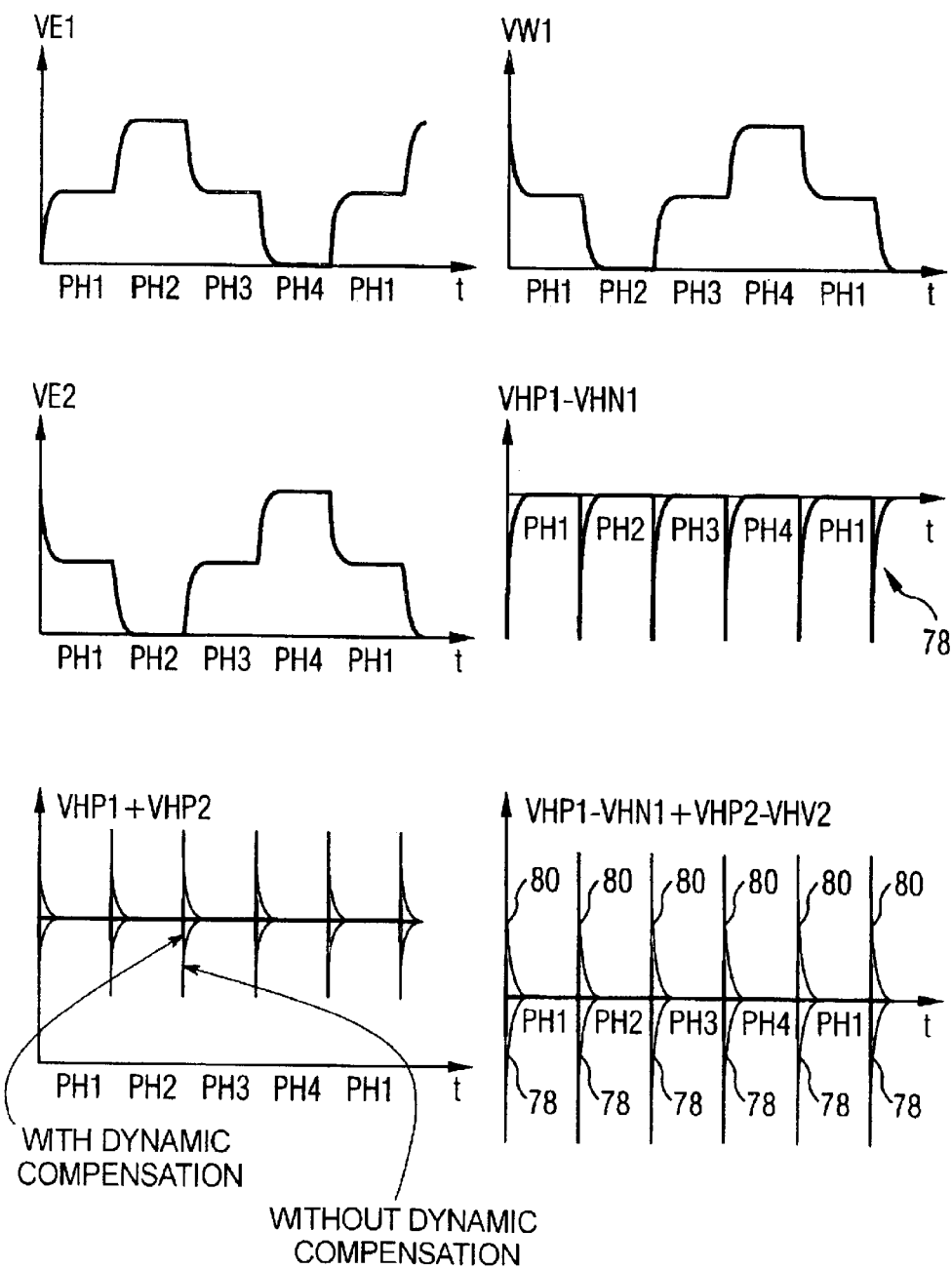
FIG. 5 shows diagrams of signals of the apparatus shown in FIG. 4.

The functioning of the analysis unit 76, which can be implemented both in analog as well as in digital circuit technology (which requires a digitalization of the Hall voltages that are taken), is explained below on the basis of the voltage curves shown in FIG. 5. In FIG. 5, the diagram at the upper left shows the curve of the potential VE1 of the first Hall sensor element 52 during various phases PH1, PH2, PH3, PH4. The excitation current I is differently impressed into the Hall sensor element in every phase. It can thereby be impressed into a terminal pair in two different directions, a total of four phases or, respectively, four different excitations of the operation of the Hall sensor element 52 resulting therefrom given two terminal pairs at the Hall sensor element 52. The corresponding curve of the potential VE2 for the second Hall sensor element 54, which is operated in the opposite rotational sense, is shown in the diagram therebelow. For the sake of completeness and a better understanding, the upper right diagram shoed the curve of the potential VW1.

It can be clearly seen with reference to the curve of the potentials that the signal edges upon transition from one phase to the other proceed similar to the charging curves of capacitances. This results from parasitic capacitances particularly due to the terminals of the Hall sensor elements 52 and 54 as well as the switchovers (not shown) of the terminals. The curve of the Hall voltage VHP1-VHN1 (corresponding to VE1-VW1) taken at the Hall sensor element 52 is shown in the middle diagram at the right. Due to the flattened edges of the potential curves VE1 and VW1, the Hall voltage comprises error signals 78 in the form of voltage spikes upon transition from one phase to the other, these falsifying the measured signal supplied by the Hall sensor.

As shown in the diagram at the lower right in FIG. 5, the Hall voltage VHP2-VHN2 of the second Hall sensor element 54 likewise comprises error signals 80 that approximately correspond to the error signals 78 in terms of amount, but have a different operational sign. The other operational sign results from the rotational sense 74 opposite the rotational sense 72, the switching between the terminal pairs for impressing the excitation current I and taking the Hall voltage being implemented with the rotational sense 74 at the second Hall sensor element 54. By addition of the Hall voltages of the first and second Hall sensor element 52 and 54, the error signals 78 and 80 can be greatly reduced, as shown by the lower left diagram in FIG. 5. For comparison, the voltage curve without dynamic compensation, i.e. without Hall sensor elements operated parallel with opposite rotational sense, is shown, for example in a measurement with a single spinning current Hall plate that is operated in only one rotational sense. In summary, thus, the influence of the error signals on the measured signal or output signal is inventively greatly reduced if not even brought to such low values that it is no longer noticeable.

While a preferred embodiment has been illustrated and described in detail in the drawings and foregoing description, the same is to be considered as illustrative and not restrictive in character, it being understood that only the preferred embodiment has been shown and described and that all changes and modifications that come within the spirit of the invention both now or in the future are desired to be protected.

I claim as my invention:

1. A method for compensation of dynamic error signals of a chopped Hall sensor that comprises at least one Hall sensor element having a plurality of terminal pairs for impressing an excitation current through the Hall sensor element and for taking a Hall voltage, comprising the steps of:
    switching the terminal pairs for impressing the excitation current and for taking the Hall voltage in one of at least a first and a second rotational sense; and
    supplying the Hall voltages taken at the terminal pairs when switching in the first rotational sense to an analysis unit for one of at least a summation and averaging together with the Hall voltages taken at the terminal pairs when switching in the second rotational sense in order to compensate dynamic error signals caused by the switching.

2. The method according to claim 1 wherein the Hall voltages at the terminal pairs when switching in the first rotational sense are taken from at least one first Hall sensor element and the Hall voltages at the terminal pairs when switching in the second rotational sense are simultaneously taken from at least one second Hall sensor element and are supplied to the analysis unit.

3. The method according to claim 1 wherein the Hall voltages at the terminal pairs when switching in the first rotational sense and the Hall voltages at the terminal pairs when switching in the second rotational sense are taken from the same Hall sensor element, the switching in the first and the switching in the second rotational sense follow successively in time and the Hall voltages taken in one rotational sense are intermediately stored during the switching in the other rotational sense.

4. The method according to claim 3 wherein a cyclical change from the switching in the first onto the switching in the second rotational sense and vice versa is undertaken.

5. The method according to claim 1 wherein the at least one Hall sensor element is operating with a spinning Hall switching.

6. The method according to claim 1 wherein the excitation current is impressed into the Hall sensor element in more than two directions.

7. A method for compensation of dynamic error signals of a chopped Hall sensor that comprises at least one Hall sensor element having a plurality of terminal pairs for impressing an excitation current through the Hall sensor element and for taking a Hall voltage, comprising the steps of:

switching the terminal pairs for impressing the excitation current and for taking the Hall voltage in one of at least a first and a second rotational sense;

supplying the Hall voltages taken at the terminal pairs when switching in the first rotational sense to an analysis unit for one of at least a summation and averaging together with the Hall voltages taken at the terminal pairs when switching in the second rotational sense in order to compensate dynamic error signals caused by the switching; and blanking out an output signal of the chopped Hall sensor is blanked out during a phase of the switching.

8. An apparatus for compensation of dynamic error signals of a chopped Hall sensor, comprising:

at least one Hall sensor element comprising a plurality of terminal pairs for impressing an excitation current through the Hall sensor element and for taking a Hall voltage;

the terminal pairs for impressing the excitation current and for taking the Hall voltage are switchable in one of at least a first and second rotational sense; and an analysis unit for at least one of summation and averaging of the Hall voltages taken at the terminal pairs when switching in the first rotational sense with the Hall voltages taken at the terminal pairs when switching in the second rotational sense in order to compensate dynamic error signals caused by the switching.

9. The apparatus according to claim 8 wherein the analysis unit is designed for processing Hall voltages at the terminal pairs when switching in the first rotational sense from at least one first Hall sensor element and the Hall voltages at the terminal pairs when switching in the second rotational sense from at least one second Hall sensor element.

10. The apparatus according to claim 8 wherein the analysis unit is designed for processing Hall voltages at the terminal pairs when switching in the first rotational sense and Hall voltages at the terminal pairs when switching in the second rotational sense are taken from the same Hall sensor element, and a memory unit wherein the Hall voltages taken in one rotational sense are intermediately stored during the switching in the other rotational sense, whereby the switching in the first and the switching in the second rotational sense follow one another in time.

11. The apparatus according to claim 10 wherein it is designed such that a cyclical change from the switching in the first onto the switching in the second rotational sense and vice versa is undertaken.

12. The apparatus according to claim 8 wherein it is designed such that the at least one Hall sensor element is operated with a spinning Hall switching.

13. The apparatus according to one of the claim 8 wherein the excitation current is impressed into the Hall sensor element in more than two directions.

14. The apparatus according to claim 8 wherein the apparatus is utilized in an integrated sensor.

15. An apparatus for compensation of dynamic error signals of a chopped Hall sensor, comprising:

at least one Hall sensor element comprising a plurality of terminal pairs for impressing an excitation current through the Hall sensor element and for taking a Hall voltage;

the terminal pairs for impressing the excitation current and for taking the Hall voltage are switchable in one of at least a first and second rotational sense;

an analysis unit for at least one of summation and averaging of the Hall voltages taken at the terminal pairs when switching in the first rotational sense with the Hall voltages taken at the terminal pairs when switching in the second rotational sense in order to compensate dynamic error signals caused by the switching; and an output signal of the chopped Hall sensor is blanked out during a phase of the switching.

16. A method for compensation of dynamic error signals of a chopped Hall sensor that comprises at least one Hall sensor element having a plurality of terminal pairs for impressing an excitation current through the Hall sensor element and for taking a Hall voltage, comprising the steps of:

switching the terminal pairs for impressing the excitation current and for taking the Hall voltage in one of at least a first and second rotational sense; and with the Hall voltages taken at the terminal pairs when switching in the first rotational sense performing one of at least a summation and averaging together with the Hall voltages taken at the terminal pairs when switching in the second rotational sense in order to compensate dynamic error signals caused by the switching.

* * * * *